United States Patent
Roh et al.

(10) Patent No.: US 7,688,149 B2
(45) Date of Patent: Mar. 30, 2010

(54) PHASE LOCKED LOOP, PHASE DETECTING METHOD FOR THE PHASE LOCKED LOOP, AND RECEIVER USING THE SAME

(75) Inventors: Hee-Jin Roh, Suwon-si (KR); Su-Jin Yoon, Suwon-si (KR); Min-Goo Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 185 days.

(21) Appl. No.: 11/453,852

(22) Filed: Jun. 16, 2006

(65) Prior Publication Data

US 2006/0284690 A1    Dec. 21, 2006

(30) Foreign Application Priority Data

Jun. 17, 2005    (KR) ............... 10-2005-0052434

(51) Int. Cl.
 *H03L 7/093* (2006.01)
(52) U.S. Cl. .................... 331/17; 331/16; 327/156; 375/376
(58) Field of Classification Search ............ 331/16, 331/17; 327/107, 156; 375/326, 376
See application file for complete search history.

(56) References Cited

U.S. PATENT DOCUMENTS

| | | | |
|---|---|---|---|
| 4,458,355 A | 7/1984 | Motley et al. | |
| 5,410,573 A | 4/1995 | Taga et al. | |
| 5,450,447 A * | 9/1995 | Dutta | 375/344 |
| 5,909,148 A | 6/1999 | Tanaka | |
| 7,260,168 B2 * | 8/2007 | Taylor et al. | 375/375 |
| 2001/0007480 A1 | 7/2001 | Hong et al. | |
| 2002/0105599 A1 | 8/2002 | Hong et al. | |

FOREIGN PATENT DOCUMENTS

| | | |
|---|---|---|
| JP | 05-347643 | 12/1993 |
| JP | 2000-022770 | 1/2000 |

\* cited by examiner

*Primary Examiner*—Robert Pascal
*Assistant Examiner*—James E Goodley
(74) *Attorney, Agent, or Firm*—Roylance, Abrams, Berdo & Goodman, LLP (57) ABSTRACT

A Phase Locked Loop (PLL) is provided for improving acquisition performance in an acquisition state, while preventing performance degradation in a steady state under a low SNR environment, during phase detection, a phase detecting method for the PLL, and a receiver using the same. The PLL determines a period to which an input signal belongs according to the input signal and a feedback signal, outputs an error signal corresponding to the input signal by using a formula (or algorithm) set for the determined period, oscillates a predetermined frequency signal according to the error signal, and feeds back the oscillated signal.

25 Claims, 12 Drawing Sheets

PHASE LOCKED LOOP, PHASE DETECTING METHOD FOR THE PHASE LOCKED LOOP, AND RECEIVER USING THE SAME

CROSS-REFERENCE TO RELATED APPLICATIONS

This application claims the benefit under 35 U.S.C. §119 (a) of Korean Patent Application No. 10-2005-0052434 entitled "Phase Locked Loop, Phase Detecting Method for the Phase Locked Loop, and Receiver Using the Same" filed in the Korean Intellectual Property Office on Jun. 17, 2005, the entire disclosure of which is herein incorporated by reference.

BACKGROUND OF THE INVENTION

1. Field of the Invention

The present invention relates generally to an apparatus and method for recovering the phase of a carrier signal. In particular, the present invention relates to a Phase Locked Loop (PLL), a phase detecting method for the PLL, and a receiver using the same.

2. Description of the Related Art

Figure 1:
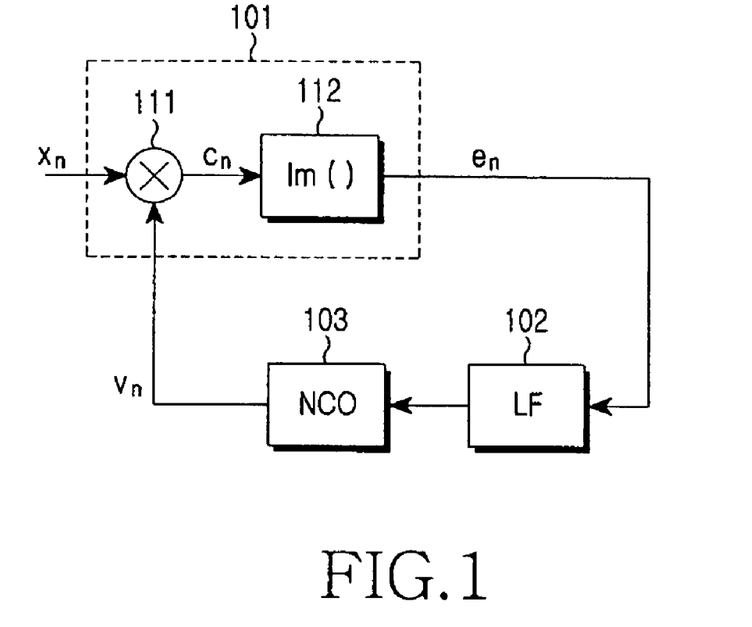
FIG. 1 is a block diagram of a PLL circuit according to a first conventional technology system.

FIG. 1 is a block diagram of a PLL circuit according to a first conventional technology system.

Referring to FIG. 1, the PLL circuit includes a phase detector 101 for extracting a phase displacement component between an input signal $x_n$ and a feedback signal $v_n$, a Loop Filter (LF) 102 for controlling the operational characteristics of the loop based on an error signal $e_n$ received from the phase detector 101, and a Numerically Controlled Oscillator (NCO) 103 for oscillating the feedback signal $v_n$ according to the output of the LF 102.

To simplify the following description, the PLL will be described below, mainly focusing on the phase detector configured to include a multiplier.

For detection of the phase difference between the input signal $x_n$ and the feedback signal $v_n$, the phase detector 101 comprises a multiplier 111 for multiplying the input signal $x_n$ and the feedback signal $v_n$ and outputting the resulting product signal $c_n$, and an imaginary value extractor 112 for outputting the magnitude of the imaginary component of the product signal $c_n$ as an error signal $e_n$.

Figure 3A:
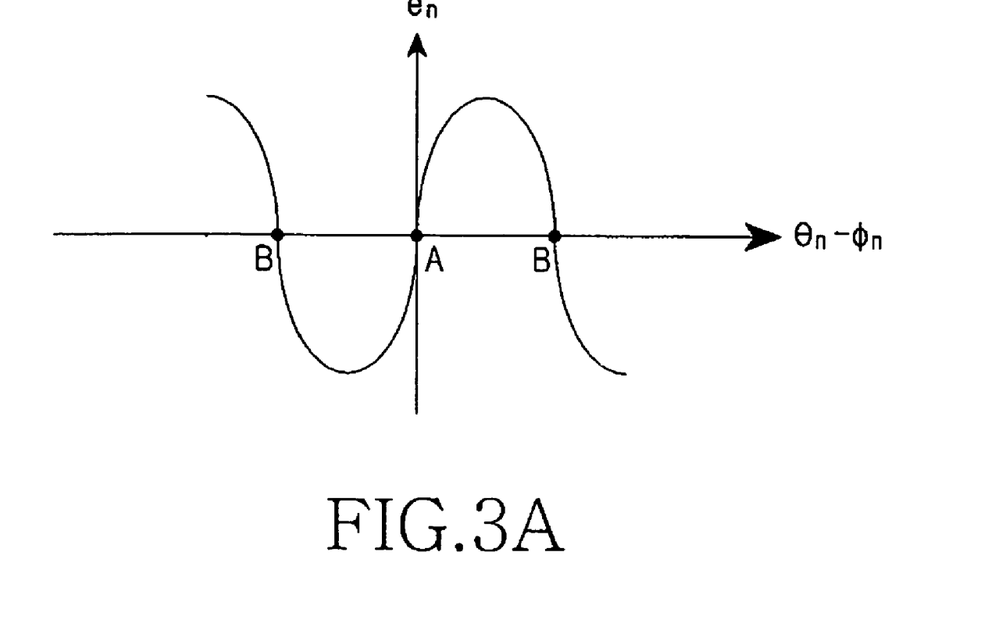
FIGS. 3A and 3B illustrate an error signal detecting method according to the first conventional technology system.
Figure 3B:
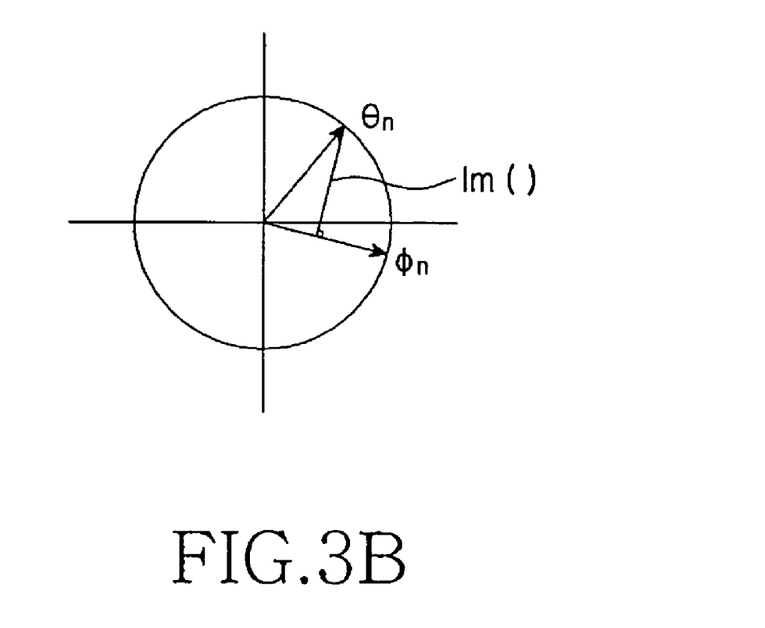

FIG. 3A illustrates the output characteristic curve of the phase detector 101 in the PLL circuit, and FIG. 3B is a diagram illustrating error signal detection in the phase detector 101.

In accordance with the above described first conventional technology system, a magnitude component (Im( ) in FIG. 3B) resulting from the projection of the input signal $v_n$ to the feedback signal $v_n$ on a complex plane is used as the error signal $e_n$.

The output $e_n$ of the phase detector 101 exhibits a sinusoidal characteristic curve as illustrated in FIG. 3A. If the signal $e_n$ is near an unstable point B, it is not converged to a stable point A for long (referred to as 'hang-up phenomenon'), thereby decreasing acquisition performance. It can, therefore, be concluded that the above phase detector 101 is not viable for applications requiring fast synchronization due to its long acquisition time.

Figure 2:
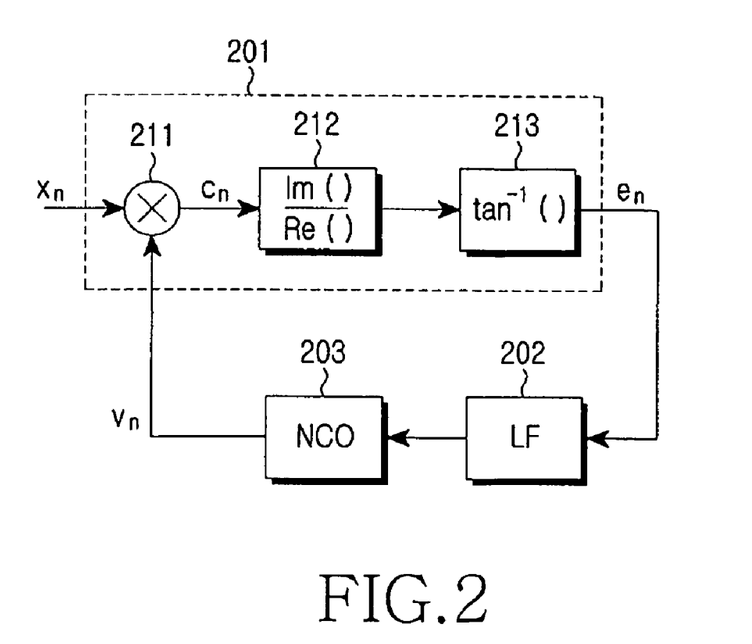
FIG. 2 is a block diagram of a PLL circuit according to a second conventional technology system.

FIG. 2 is a block diagram of a PLL circuit according to a second conventional technology system.

Referring to FIG. 2, the PLL circuit includes a phase detector 201 for extracting a phase displacement component between an input signal $x_n$ and a feedback signal $v_n$, an LF 202 for determining an oscillation frequency for an NCO 203 based on an error signal $e_n$ received from the phase detector 201, and the NCO 203 for oscillating the feedback signal $v_n$ according to the output of the LF 202.

For detection of the phase difference between the input signal $x_n$ and the feedback signal $v_n$, the phase detector 201 comprises a multiplier 211 for multiplying the input signal $x_n$ by the feedback signal $v_n$ and outputting the resulting product signal $c_n$, a divider 212 for dividing the imaginary component Im( ) of the product signal $c_n$ by its real component, and an angle calculator 213 for calculating an arc tangent to extract an angle component from the output of the divider 212.

Figure 4A:
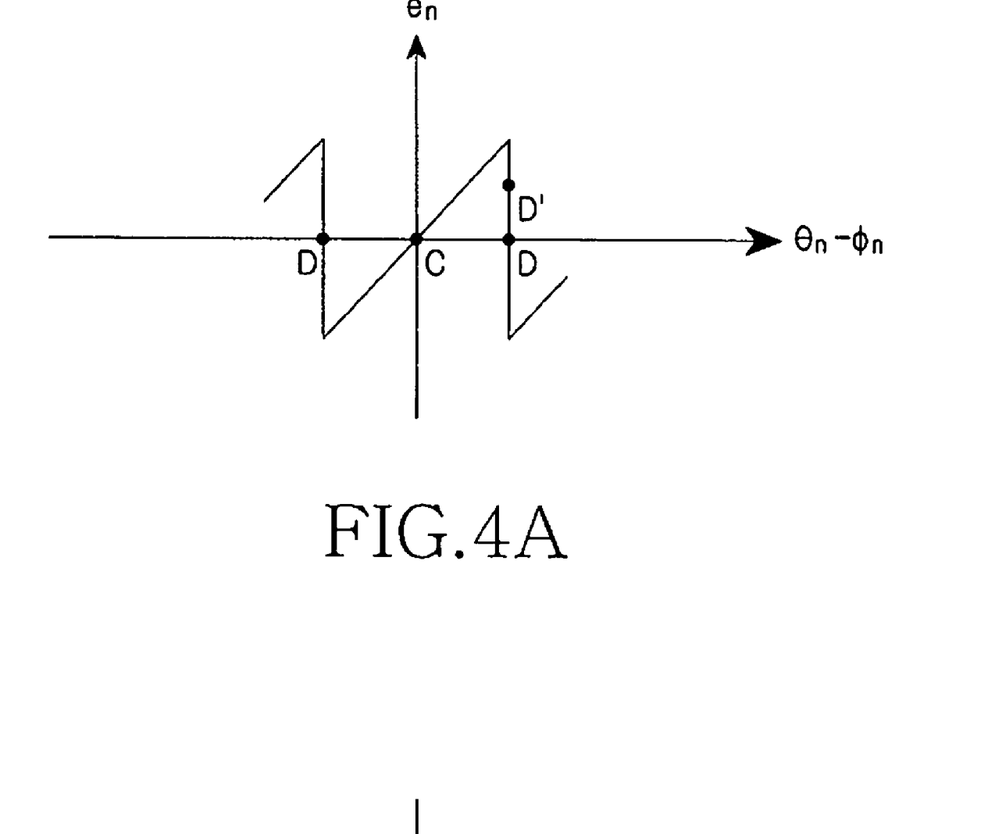
FIGS. 4A and 4B illustrate an error signal detecting method according to the second conventional technology system.
Figure 4B:
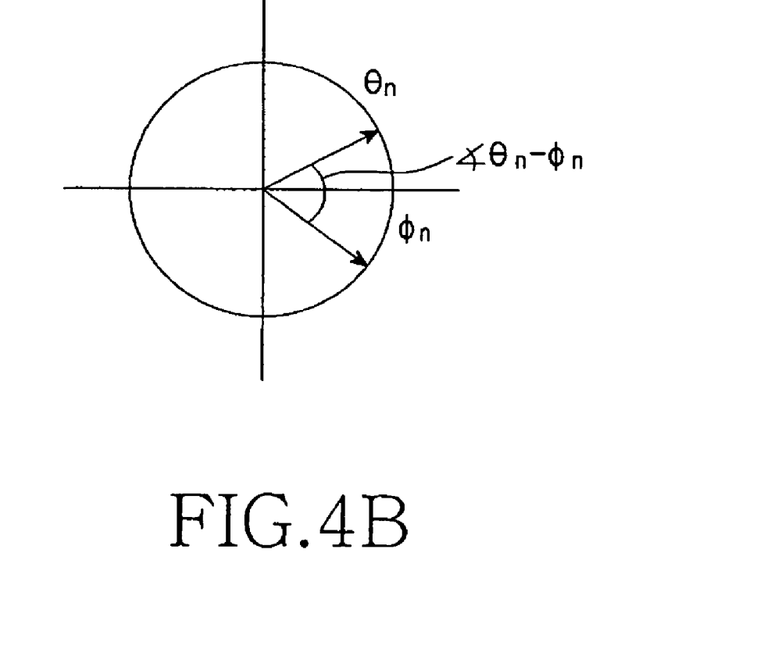

FIGS. 4A and 4B illustrate an error signal detecting method according to the second conventional technology system. Specifically, FIG. 4A illustrates the output characteristic curve of the phase detector 201 and FIG. 4B is a diagram illustrating error signal detection in the phase detector 201.

In accordance with the second conventional technology system, the angle between the input signal $x_n$ and the feedback signal $v_n$ on a complex plane is calculated and used as the error signal $e_n$.

The characteristic curve of the phase detector 201 is a saw function, as illustrated in FIG. 4A. Hence, if the output signal $e_n$ is near an unstable point D, its value is high and thus, acquisition time to a stable point C is short. Since the phase detector 201 overcomes the hang-up phenomenon encountered with the first conventional technology system phase detector PLL 101, it is more suitable for applications requiring fast acquisition.

However, since most phase detectors using the saw function are so configured as to receive a complex value and output its angle, noise enhancement in a low Signal-to-Noise Ratio (SNR) environment decreases steady-state performance.

Moreover, when the output of the phase detector 201 is located at the unstable point D, acquisition time may be lengthened in the low SNR environment.

Further, to perform division and an arc tangent function, a look-up table may be used. For a large number of bits, however, this look-up table requires a large volume of hardware computations.

Still further, while the problem of increase in jitter in a steady state under a low SNR may be solved by decreasing a loop gain, this results in an increased acquisition time.

Accordingly, a need exists for a system and method for improving acquisition performance in an acquisition state, while preventing performance degradation in a steady state under a low SNR environment.

SUMMARY OF THE INVENTION

An object of the present invention is to substantially solve at least the above problems and/or disadvantages, and to provide at least the advantages below. Accordingly, embodiments of the present invention provide a PLL for improving acquisition performance in an acquisition state, while preventing performance degradation in a steady state under a low SNR environment, during phase detection, a phase detecting method for the PLL, and a receiver using the same.

According to one aspect of embodiments of the present invention, in a PLL circuit, a phase detector determines a period to which an input signal belongs using the input signal and a feedback signal, and outputs an error signal corresponding to the input signal by using a formula (or algorithm) set for the determined period. A loop filter loop-filters the error signal. An oscillator oscillates a predetermined frequency signal according to the loop-filtered error signal and provides the oscillated signal as the feedback signal to the phase detector.

According to another aspect of embodiments of the present invention, in a digital phase locking method, a period to which an input signal belongs is determined using the input signal and a feedback signal. An error signal corresponding to the input signal is calculated by using a formula (or algorithm) set for the determined period and loop-filtered. A predetermined frequency signal is oscillated according to the loop-filtered error signal, and the oscillated signal is fed back.

According to a further aspect of embodiments of the present invention, in a receiver, a reception part receives an RF signal from an antenna and outputs an IF signal. An ADC converts the IF signal into a digital signal. A PLL compensates the phase of the digital signal. A synchronizer synchronizes the frequency of the digital signal based on the output of the PLL. The PLL determines a period to which an input signal belongs according to the input signal and a feedback signal, outputs an error signal corresponding to the input signal by using a formula (or algorithm) set for the determined period, oscillates a predetermined frequency signal according to the error signal, and feeds back the oscillated signal.

According to still another aspect of embodiments of the present invention, in a receiver, a reception part receives an RF signal from an antenna and outputs a baseband signal. An ADC converts the baseband signal into a digital signal. A PLL compensates the phase of the digital signal. Particularly, the PLL determines a period to which an input signal belongs according to the input signal and a feedback signal, outputs an error signal corresponding to the input signal by using a formula (or algorithm) set for the determined period, oscillates a predetermined frequency signal according to the error signal, and feeds back the oscillated signal.

According to yet another aspect of embodiments of the present invention, in a receiver, a reception part receives an RF signal from an antenna and outputs a baseband signal. An ADC converts the baseband signal into a digital signal. A sampler acquires time synchronization for the digital signal. A PLL compensates the phase of the time-synchronized digital signal. Particularly, the PLL determines a period to which an input signal belongs according to the input signal and a feedback signal, outputs an error signal corresponding to the input signal by using a formula (or algorithm) set for the determined period, oscillates a predetermined frequency signal according to the error signal, and feeds back the oscillated signal.

BRIEF DESCRIPTION OF THE DRAWINGS

The above and other objects, features and advantages of embodiments of the present invention will become more apparent from the following detailed description when taken in conjunction with the accompanying drawings, in which.

Throughout the drawings, like reference numerals will be understood to refer to like parts, components and structures.

DETAILED DESCRIPTION OF THE EXEMPLARY EMBODIMENTS

Exemplary embodiments of the present invention will be described herein below with reference to the accompanying drawings. In the following description, well-known functions or constructions are not described in detail since they would obscure the invention in unnecessary detail.

To provide a description of an operation of an exemplary PLL according to embodiments of the present invention, a phase offset compensating apparatus using the PLL will be presented as an exemplary embodiment. Accordingly, at a receiver, an input digital signal $x_n$ is expressed as shown in Equation (1) below, $$x_n = a_n \exp(j2\pi\theta_n) + w_n \quad (1)$$

wherein $a_n$ is the magnitude of the input signal, $w_n$ is a noise component included in a corresponding channel, and $\theta_n$ is a phase offset added by the difference between vibrators at a transmitter and a receiver and by the channel. To compensate for the phase offset $\theta_n$, the receiver generates a phase correction signal expressed as $v_n = \exp(j2\pi\phi_n)$ through an NCO. For phase correction, the input signal $x_n$ is multiplied by the phase correction signal $v_n$ as shown in Equation (2) below, $$c_n = x_n \times v_n^* \quad (2)$$

wherein $z^*$ represents the complex conjugate of z. According to embodiments of the present invention, a phase detector exhibits a modified characteristic curve.

Figure 5:
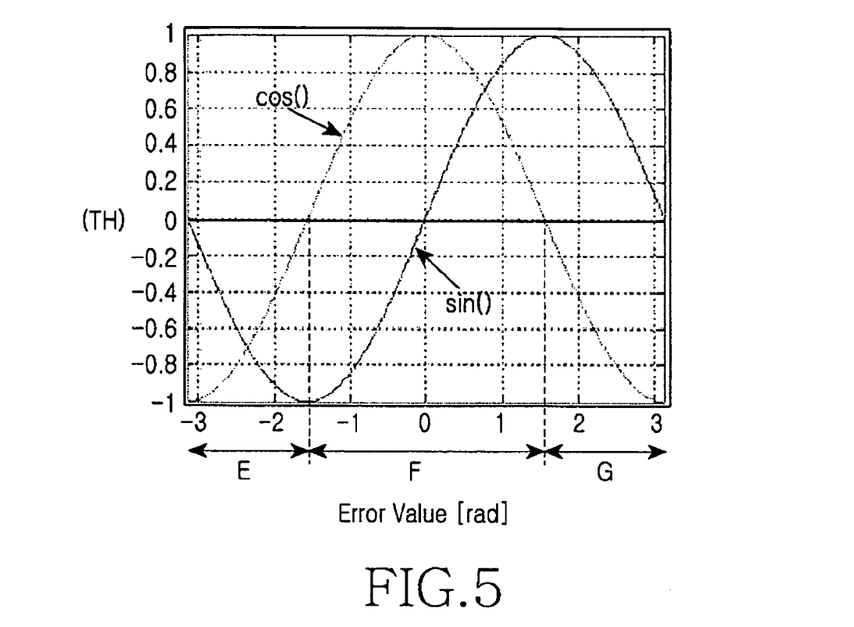
FIG. 5 is a graph illustrating an exemplary output waveform of a phase detector according to an error signal.
Figure 6:
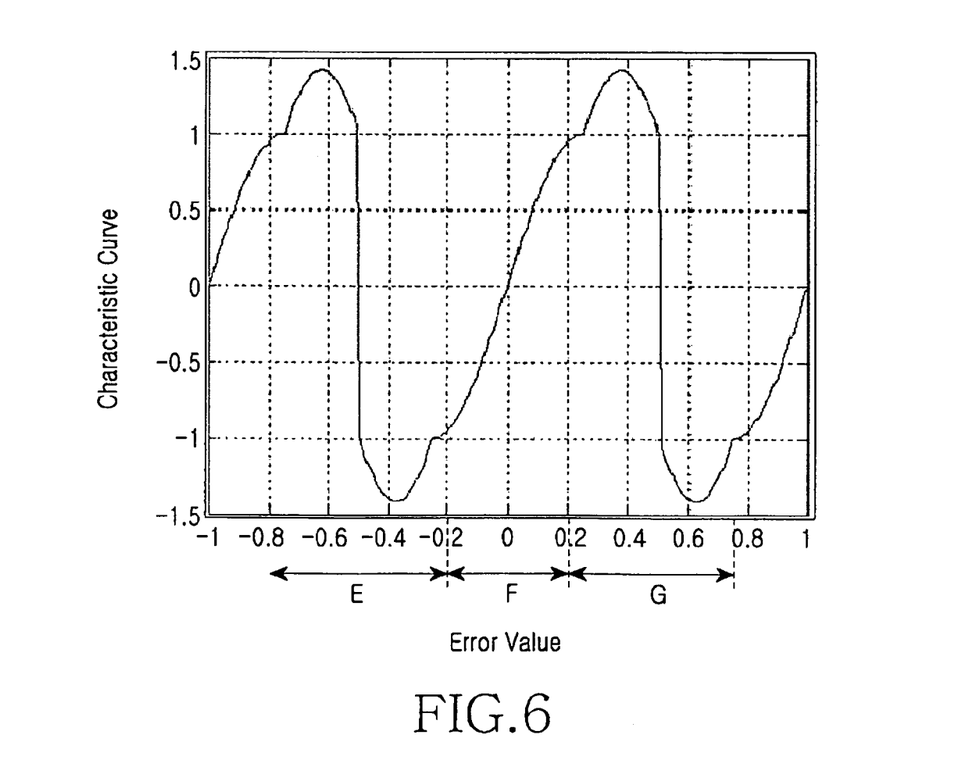
FIG. 6 is a graph illustrating an exemplary output waveform of a phase detector in a PLL according to an embodiment of the present invention.

FIG. 5 is a graph illustrating an exemplary output waveform of a phase detector according to an error signal, and FIG. 6 is a graph illustrating an exemplary output waveform of a phase detector in a PLL according to an embodiment of the present invention.

Referring to FIG. 5, to overcome the drawback of the sinusoidal output waveform of the conventional phase detector, there is a need for changing the characteristic curve of the phase detector such that when an error is near $\pi$, the output of the phase detector is high.

For this purpose, embodiments of the present invention use both the imaginary and real parts of the phase detector output $c_n$, as illustrated in FIG. 5. Since the real part of $c_n$ has the shape of a cosine curve, it is used to determine whether an error is near $\pi$ or whether convergence has already occurred. If the real part of $c_n$ is near 0, the phase detector has the conventional sinusoidal characteristic. If it is near $\pi$, the phase characteristic is enhanced by adding or subtracting the real part of $c_n$ to or from the imaginary part of $c_n$.

Referring to FIG. 6, the characteristic curve of the phase detector according to embodiments of the present invention is similar to a saw function curve except that it is sinusoidal in the vicinity of an error of 0. More specifically, to achieve a desired signal from the phase detector, a threshold TH is preset and the real part $\text{Re}(c_n)$ of $c_n$ being a cosine wave is separated into two periods. In one period, $\text{Re}(c_n)$ is equal to or higher than TH and in the other period, $\text{Re}(c_n)$ is less than TH. The latter period is further broken up into two periods depending on whether the imaginary part $\text{Im}(c_n)$ of $c_n$ is equal to or greater than 0, or less than 0.

While TH is set to 0, it can be expanded within a predetermined range. If TH is increased, the sinusoidal period is lengthened, suitably for a broad acquisition state period. If TH is decreased, the sinusoidal period is shortened, suitably for a narrow acquisition state period.

In FIGS. 5 and 6, reference character F denotes the period in which $\text{Re}(c_n)$ is equal to or greater than TH. Reference character E denotes the period in which $\text{Re}(c_n)$ is less than TH and $\text{Im}(c_n)$ is less than 0. Reference character G denotes the period in which $\text{Re}(c_n)$ is less than TH and $\text{Im}(c_n)$ is equal to or greater than 0.

After the period classification, the sinusoidal imaginary value $\text{Im}(c_n)$ is taken in the period F and the sum of the imaginary value $\text{Im}(c_n)$ being a sine value and the real value $\text{Re}(c_n)$ being a cosine value is taken in the period E. The difference obtained by subtracting the real value $\text{Re}(c_n)$ from the imaginary value $\text{Im}(c_n)$ is taken in the period G.

As illustrated in FIG. 6, therefore, when a phase error is small as shown in the period F, the output characteristic curve of the phase detector is a sine function. When a phase error is large as shown in the periods E and G, the output characteristic curve of the phase detector is similar to a saw function.

An exemplary algorithm for achieving the output waveform (error signal) illustrated in FIG. 6 can be written in C language, as shown in Algorithm A-1 below.

```
if (Re[c_n] ≧ TH){
  e_n = Im[c_n];
}
else{
  if(Im[c_n] ≧ 0)
    e_n = Im[c_n]−Re[c_n];
  else
    e_n = Im[c_n] + Re[c_n];
}
```
.....A-1

Figure 7:
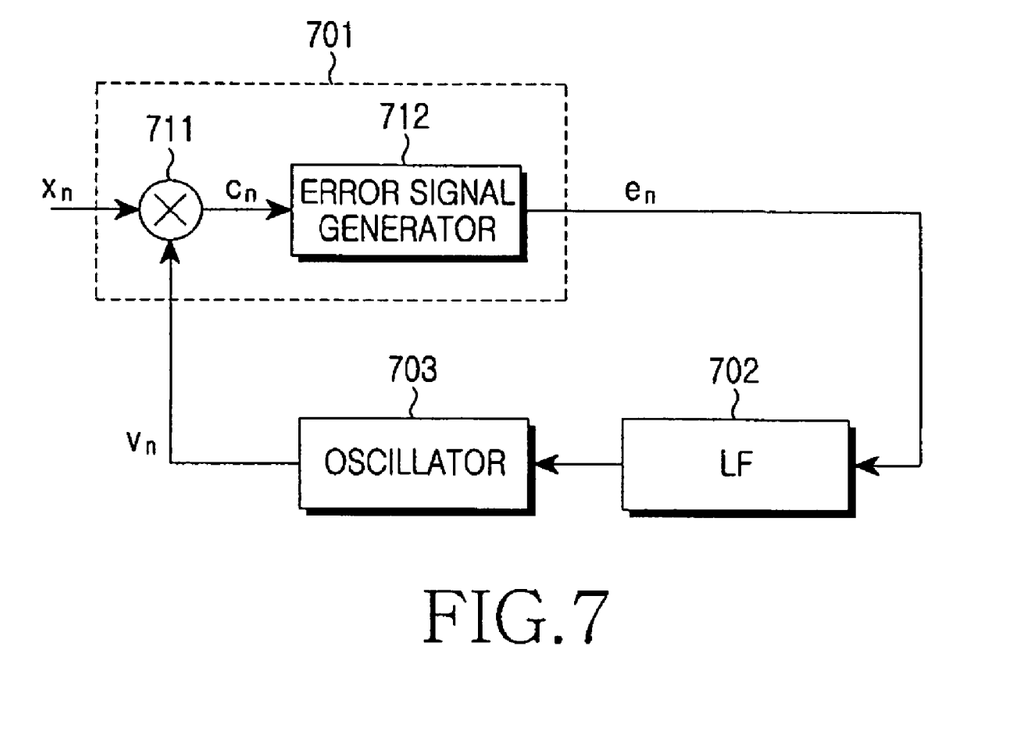
FIG. 7 is a block diagram of an exemplary PLL circuit according to an embodiment of the present invention.

FIG. 7 is a block diagram of an exemplary PLL circuit operating by the execution of the above described algorithm A-1 according to embodiments of the present invention.

Referring to FIG. 7, the PLL circuit comprises a phase detector 701 for dividing the period of an input signal by comparing the input signal with a predetermined threshold and outputting an error signal having a different waveform for each divided period, an LF 702 for performing loop filtering based on the error signal received from the phase detector 701, and an oscillator 703 for oscillating at a desired frequency signal according to the loop-filtered error signal and providing the oscillated signal to the phase detector 701 in a feedback loop.

The input signal $x_n$ comprises a digital signal having a real part and an imaginary part. The phase detector 701 compares the values of the real and imaginary parts. If the real value is equal to or greater than the threshold, the phase detector 701 outputs the imaginary value. If the real value is less than the threshold, the phase detector 701 further compares the imaginary value with 0. If the imaginary value is equal to or greater than 0, the phase detector 701 creates an error signal by subtracting the real value from the imaginary value. If the imaginary value is less than 0, the phase detector 701 sets the error signal to the sum of the real and imaginary values.

To detect the phase difference between the input signal $x_n$ and the feedback signal $v_n$, the phase detector 701 comprises a multiplier 711 for multiplying the input signal $x_n$ by the feedback signal $v_n$ and outputting the resulting signal $c_n$, and an error signal generator 712 for outputting an error signal having a different characteristic in each period based on the product signal $c_n$.

The oscillator 703 comprises an NCO for digital operation or a Voltage Controlled Oscillator (VCO) for analog operation.

Figure 8:
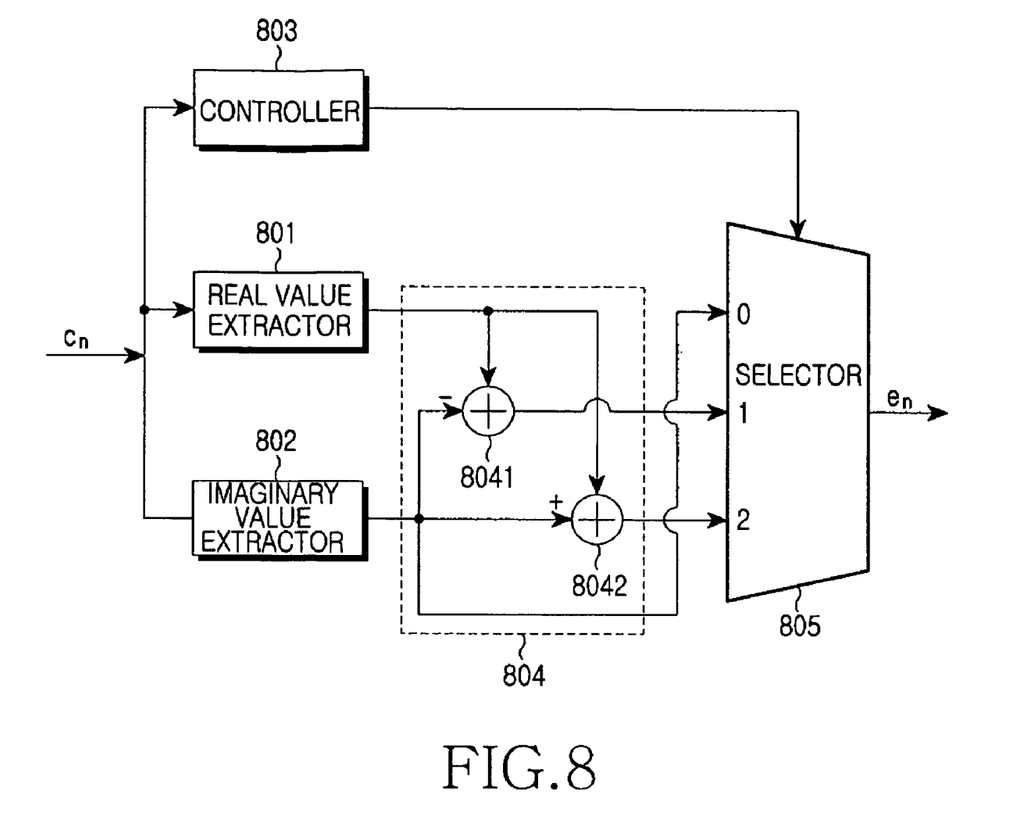
FIG. 8 is a detailed block diagram of an exemplary error signal generator illustrated in FIG. 7 according to an embodiment of the present invention.

FIG. 8 is a detailed block diagram of an exemplary error signal generator 712 according to an embodiment of the present invention.

Referring to FIG. 8, the error signal generator 712 comprises a real value extractor 801 for extracting a real value from the product signal $c_n$ received from the multiplier 711, an imaginary value extractor 802 for extracting an imaginary value from the product signal $c_n$, a calculator 804 for generating a plurality of calculation values using the real and imaginary values, a selector 805 for selecting one of the calculation values, and a controller 803 for outputting a selection signal for controlling the selector 805.

The calculator 804 comprises a subtractor 8041 for calculating the difference between the real and imaginary values and an adder 8042 for adding the real and imaginary values.

In the illustrated case of FIG. 8, the calculator 804 outputs three calculation values and the selector 805 selects one of the calculation values according to the selection signal.

Compared to a conventional phase detector as illustrated in FIG. 2, the exemplary phase detector 701 having the configuration illustrated in FIGS. 7 and 8 performs threshold comparison and addition/subtraction once each, and thus, has a more simplified structure.

If the threshold is 0, the addition/subtraction suffices without the comparison.

While the phase detector 701 is configured such that the real value extractor 801 and the imaginary value extractor 802 extract the real and imaginary values from the input signal $c_n$, respectively and the controller 803 also extracts the real and imaginary values from the input signal $c_n$, to thereby control the selector 805 in FIG. 8, in yet another embodiment of the present invention, the controller 803 can receive the real and imaginary values from the real value extractor 801 and the imaginary value extractor 802.

As shown in FIGS. 6, 7 and 8, the phase detector of embodiments of the present invention have a more simple configuration, while exhibiting a phase detection characteristic approximate to conventional saw-shaped phase detection characteristic.

A description will now be made of simulation results of a phase detector in a PLL according to embodiments of the present invention in terms of jitter performance and acquisition performance in a steady state.

Figure 9:
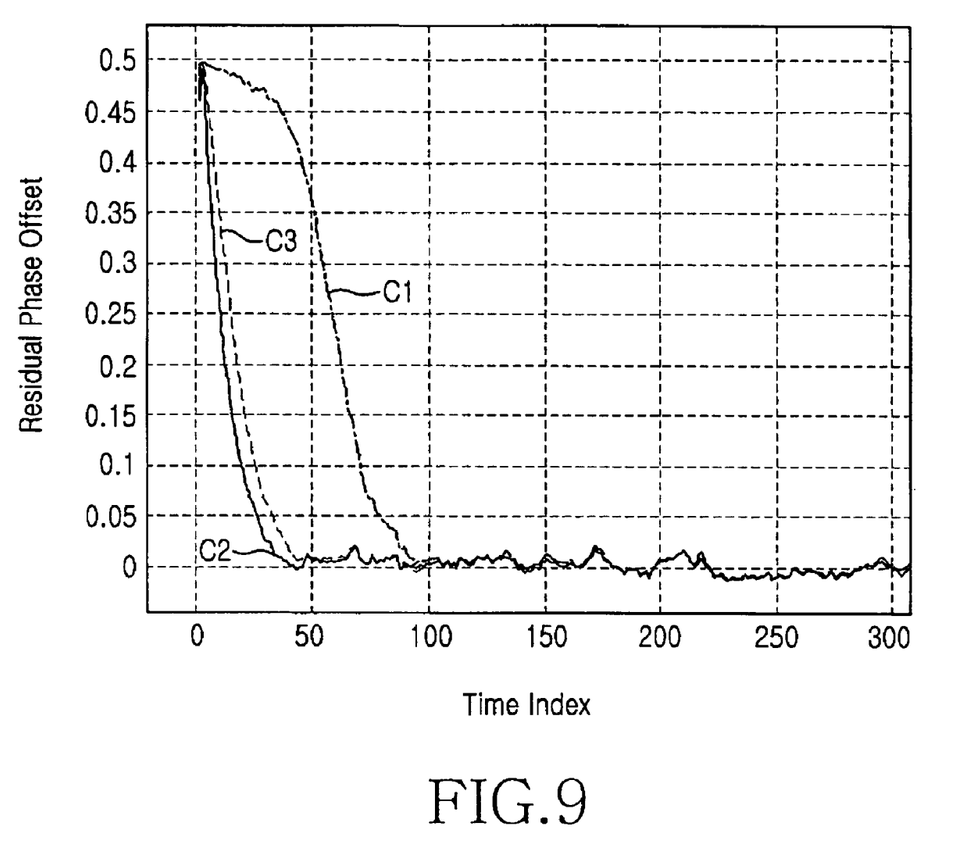
FIGS. 9 and 10 illustrate exemplary convergence curves representing changes in residual phase offset over time.
Figure 10:
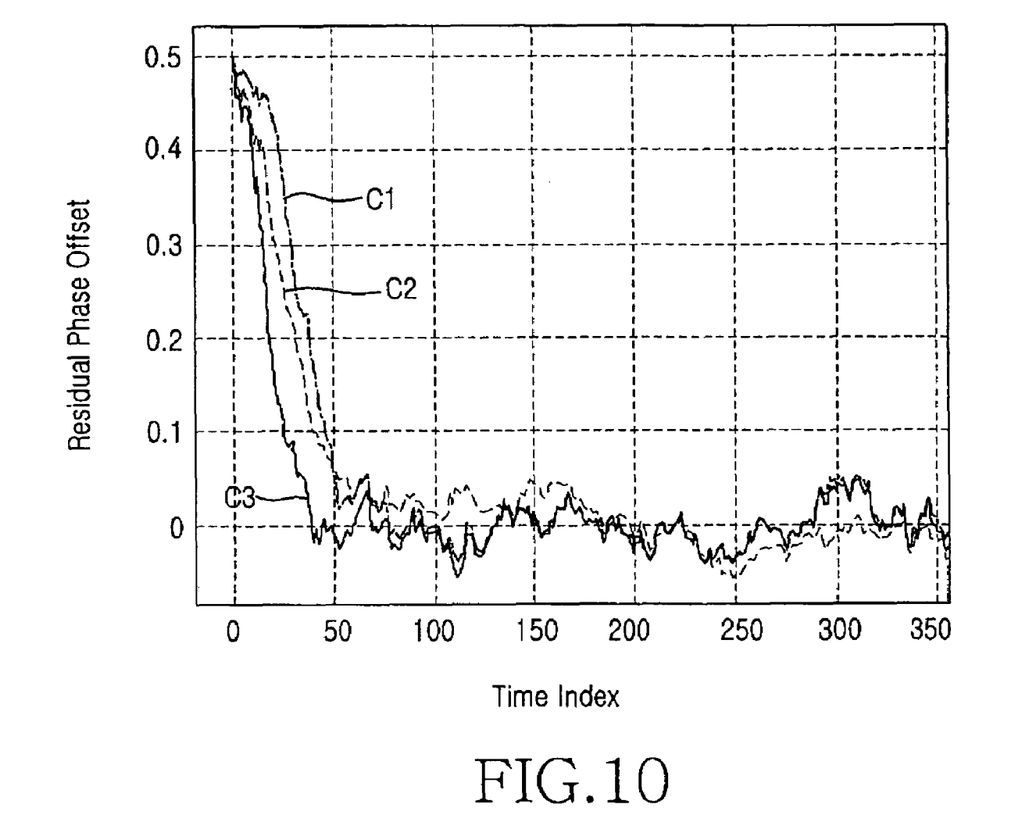

FIGS. 9 and 10 illustrate exemplary convergence curves representing changes in residual phase offset over time.

Referring to FIG. 9, the results are shown of a simulation performed under an initial phase offset of 0.5, an SNR of 10 dB, and a threshold of 0 to evaluate convergence characteristics of conventional technologies and embodiments of the present invention in terms of convergence time over time.

The values of C1 and C2 denote the convergence curves of the first and second conventional technologies, and C3 denotes the convergence curve of embodiments of the present invention. The convergence curves all have substantially the same steady-state error variance. As noted from FIG. 9, embodiments of the present invention have a convergence characteristic approximate to the performance of a PLL using the phase detector having the saw-shaped characteristic curve according to the second conventional technology. In addition, embodiments of the present invention simplify the hardware configuration of the phase detector, compared to the phase detector having the saw-shaped characteristic curve.

FIG. 10 illustrates convergence characteristics in terms of convergence time over time under the simulation conditions where the phase offset is 0.5, the SNR is 0 dB, and the threshold is 0.

Referring to FIG. 10, the results illustrate that embodiments of the present invention outperform the second conventional technology in terms of acquisition performance under a low SNR, as the SNR is decreased to 0 dB. This is because the PLL with the phase detector having the saw-shaped characteristic curve experiences degradation of phase error estimation performance due to increased noise under the low SNR environment, thereby degrading the convergence characteristic.

As described above, the PLL of embodiments of the present invention virtually has the same steady-state jitter performance as that of a PLL using the conventional phase detector having a sinusoidal characteristic curve, and has an enhanced steady-state acquisition performance comparable to that of a PLL using the conventional phase detector having a saw-shaped characteristic curve.

Figure 14:
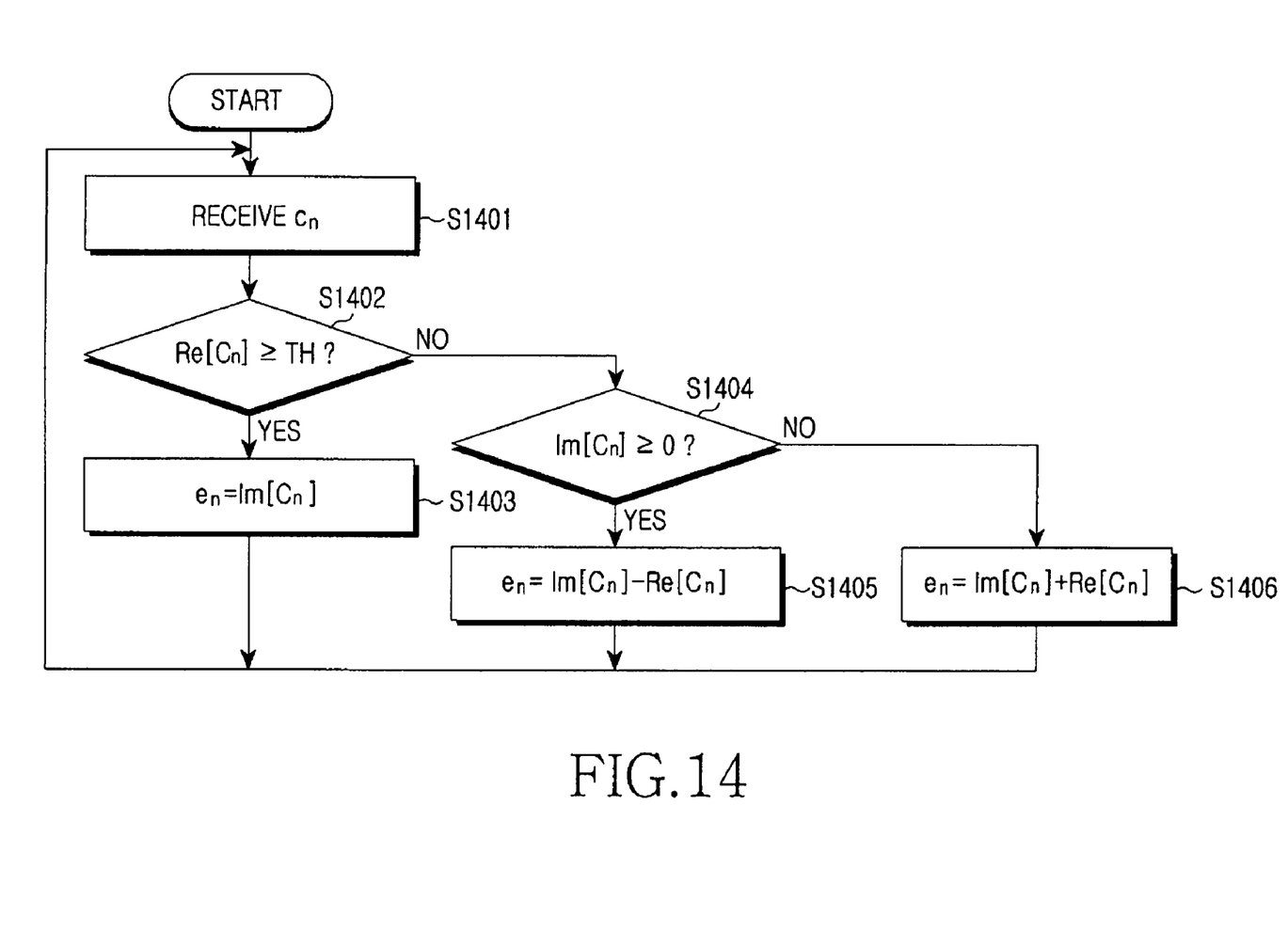
FIG. 14 is a flowchart illustrating an exemplary phase detecting method according to embodiments of the present invention.

FIG. 14 is a flowchart illustrating an exemplary phase detecting method according to embodiments of the present invention.

Referring to FIG. 14, the phase detector receives the digital Intermediate Frequency (IF) signal $c_n$ having a real part and an imaginary part in step S1401. The signal $c_n$ is achieved by multiplying the input signal $x_n$ by the feedback signal $v_n$.

In step S1402, the real value $Re(c_n)$ of $c_n$ is compared with the threshold TH. If $Re(c_n)$ is equal to or greater than TH, the imaginary value $Im(c_n)$ of $c_n$ is taken as the error signal $e_n$ in step S1403.

If $Re(c_n)$ is less than TH, the phase detector compares the imaginary value $Im(c_n)$ with 0 in step S1404. If the imaginary value $Im(c_n)$ is equal to or greater than 0, the phase detector sets the error signal $e_n$ to the difference resulting from subtracting $Re(c_n)$ from $Im(c_n)$ in step S1405.

If $Im(c_n)$ is less than 0, the phase detector sets the error signal $e_n$ to the sum of $Re(c_n)$ and $Im(c_n)$ in step S1406.

After steps S1403, S1405, and S1406, the LF and the oscillator are activated and the phase value of the oscillator is updated. Then the above procedure is repeated.

The phase detector in the PLL operates according to the above phase detection algorithm. The PLL, which fixes the input signal at a particular phase point for synchronization, can find wide use in wired/wireless receivers.

Hereinbelow, exemplary receivers using a PLL according to embodiments of the present invention will be described.

Figure 11:
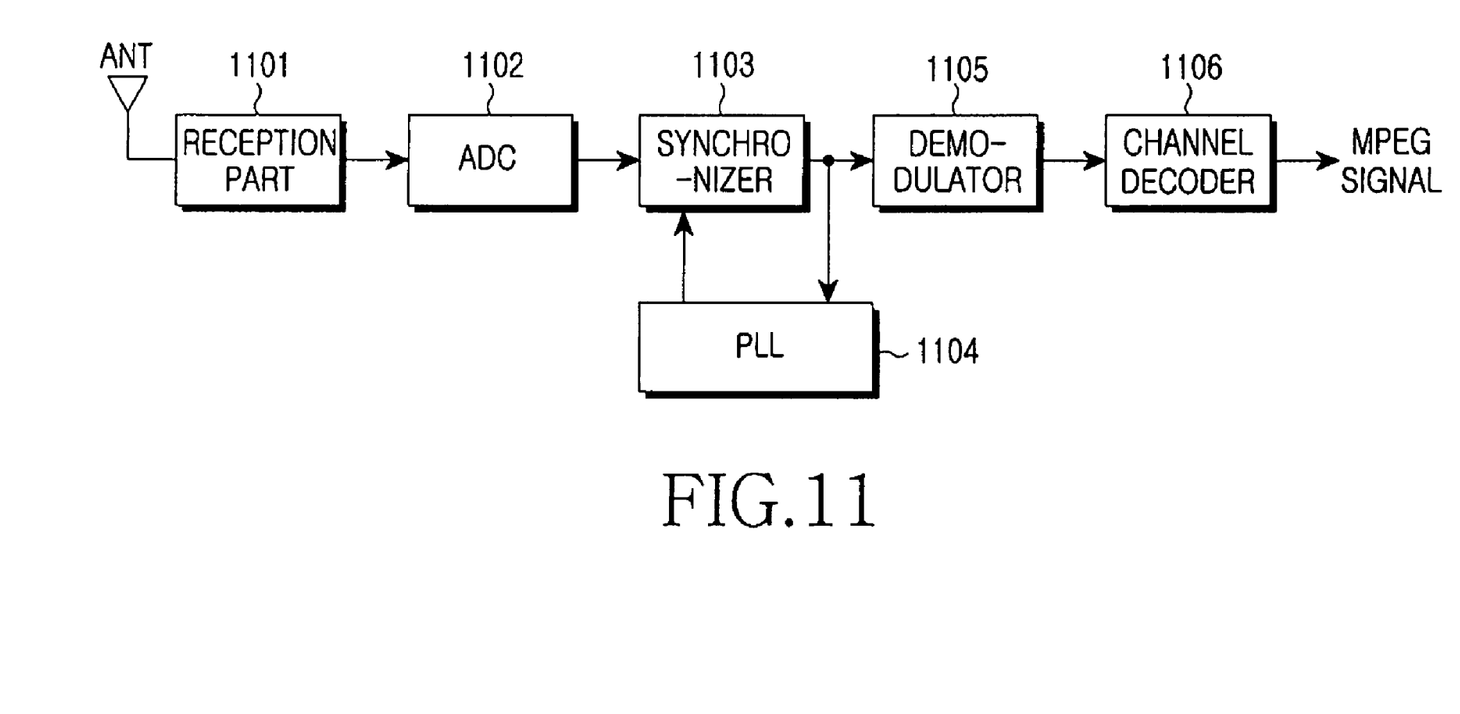
FIG. 11 is a block diagram of an exemplary receiver using a PLL according to a first embodiment of the present invention.

FIG. 11 is a block diagram of an exemplary receiver using a PLL according to a first embodiment of the present invention.

Referring to FIG. 11, the receiver comprises a reception part 1101 for processing a Radio Frequency (RF) signal through an antenna (ANT) in a predetermined manner into an IF signal, an Analog-to-Digital Converter (ADC) 1102 for converting the IF signal into a digital signal, a synchronizer 1103 for acquiring frequency synchronization for the IF digital signal using the output of a PLL 1104, a demodulator 1105 for demodulating the baseband signal received from the synchronizer 1103, and a channel decoder 1106 for decoding the demodulated signal.

The PLL 1104 has a configuration as illustrated in FIG. 7. The PLL 1104 is comprised of a phase detector for classifying periods by comparing an input signal with a threshold and outputting an error signal having a different output waveform for each period, an LF for performing loop filtering based on the error signal, and an oscillator for oscillating an intended frequency signal based on the loop-filtered error signal and providing the oscillated signal to the phase detector and the synchronizer 1103.

While phase compensation is carried out at a digital signal level using the PLL in the above exemplary embodiments, in yet other embodiments of the present invention, the phase compensation can also be carried out at an analog signal level.

Figure 12:
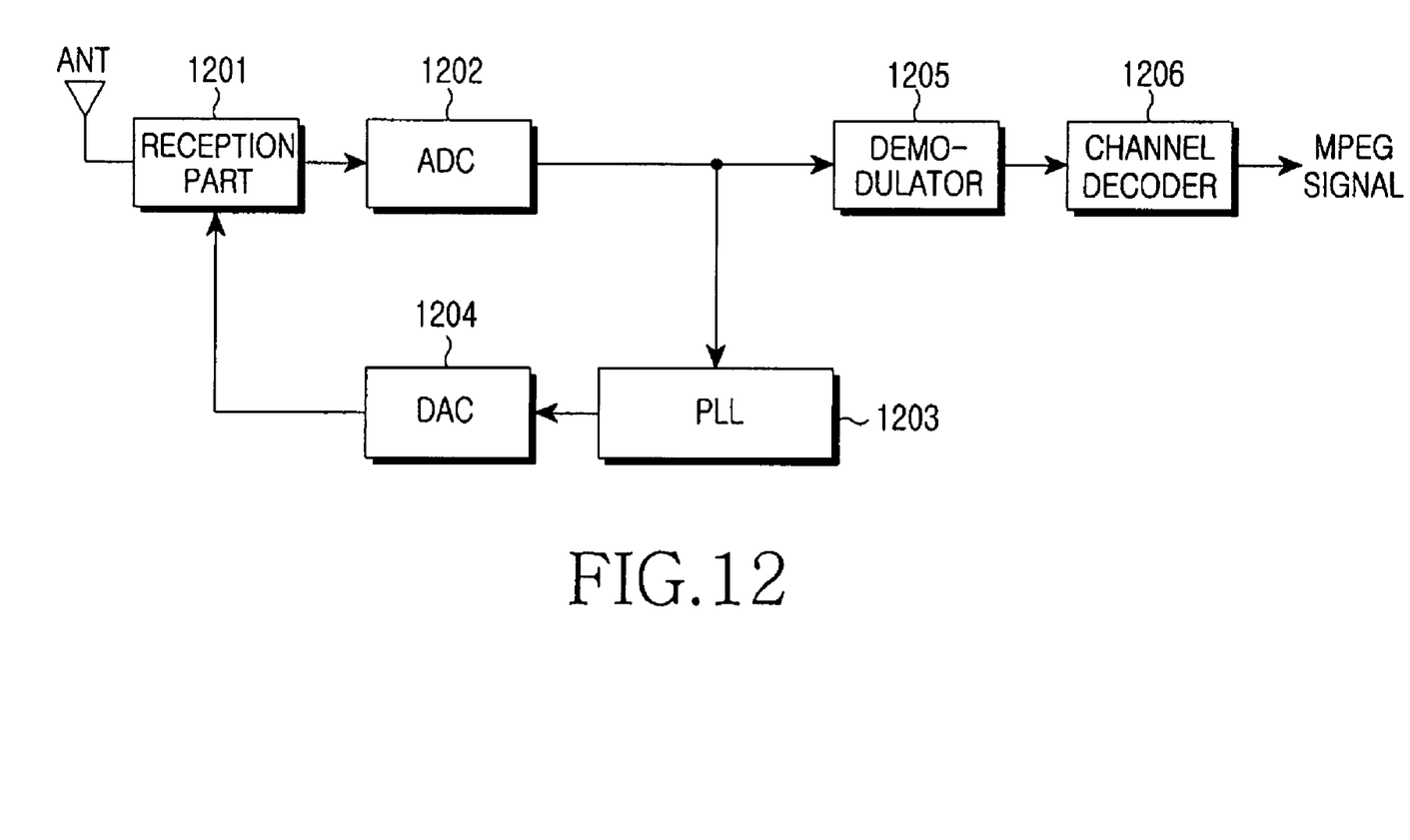
FIG. 12 is a block diagram of an exemplary receiver using a PLL according to a second embodiment of the present invention.

FIG. 12 is a block diagram of a receiver using a PLL according to a second embodiment of the present invention.

Referring to FIG. 12, the receiver comprises a reception part 1201 for processing an RF signal received through an antenna into a baseband signal in a predetermined method, an ADC 1202 for converting the baseband signal into a digital signal, a PLL 1203 for compensating the phase of the baseband digital signal and outputting an intended frequency signal, a demodulator 1205 for demodulating the baseband digital signal, and a channel decoder 1206 for decoding the demodulated signal.

The receiver further comprises a Digital-to-Analog Converter (DAC) 1204 for converting the output of the PLL 1203 into an analog signal and providing the analog signal to the reception part 1201 being an analog signal processor in a feedback loop, for phase compensation at an analog level. The converted analog output of the PLL 1203 is provided to a mixer of the reception part 1201.

While the ADC output is provided to the PLL in both first and second embodiments of the present invention, in yet other embodiments of the present invention, the demodulator output can be provided to the PLL.

The first and second embodiments of the present invention carry out phase compensation (Df) using the PLL. However, they are also applicable to time compensation (Dt) using the PLL.

Figure 13:
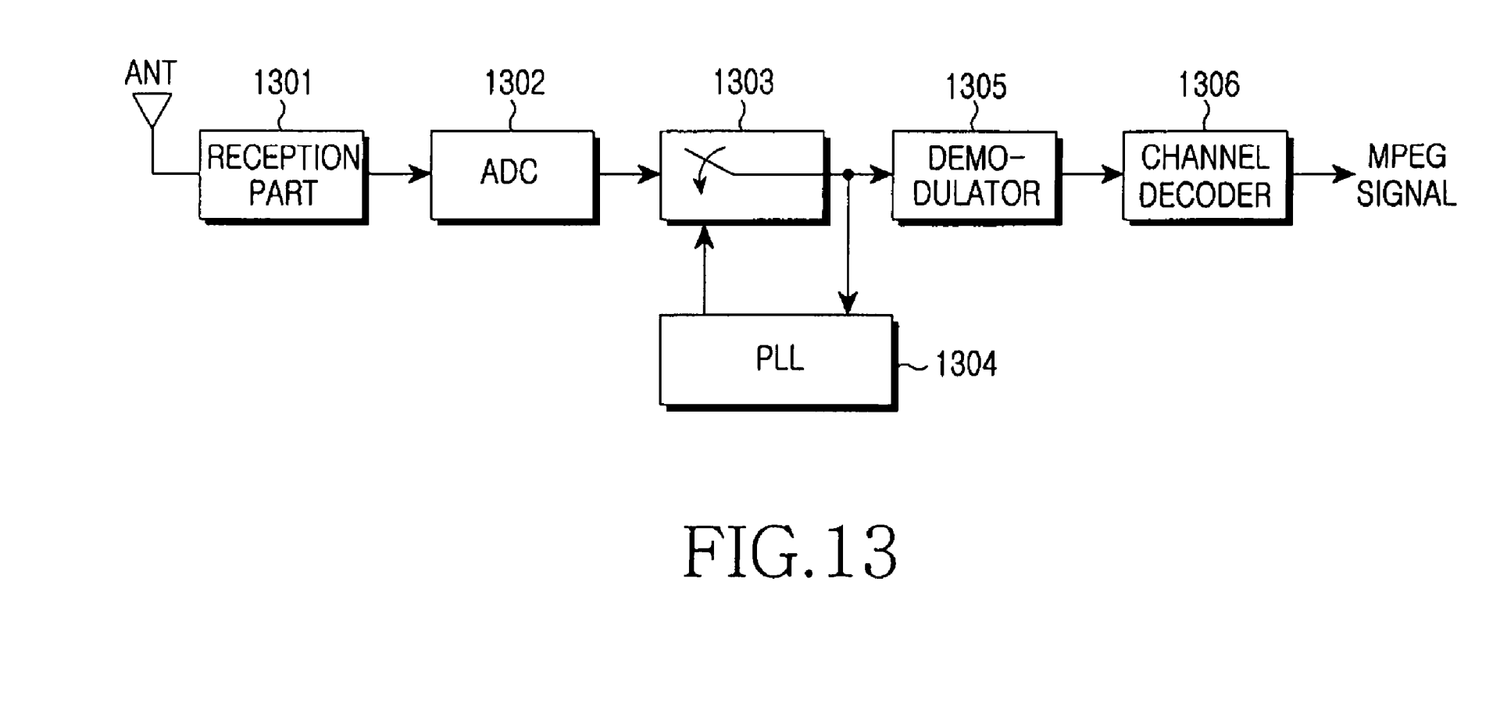
FIG. 13 is a block diagram of an exemplary receiver using a PLL according to a third embodiment of the present invention.

FIG. 13 is a block diagram of an exemplary receiver using a PLL for time compensation according to a third embodiment of the present invention.

Referring to FIG. 13, the receiver comprises a reception part 1301 for processing an RF signal received through an antenna into a baseband signal in a predetermined method, an ADC 1302 for converting the baseband signal into a digital signal, a sampler 1303 for performing time compensation on the baseband digital signal using the output of a PLL 1304, the PLL 1304, a demodulator 1305 for demodulating the baseband signal received from the sampler 1303, and a channel decoder 1306 for decoding the demodulated signal.

In the above-described embodiments, the use of the phase detector of the present invention maintains steady-state performance because it exhibits a sinusoidal characteristic curve in the vicinity of a stable point, and reduces the hang-up phenomenon and reduces acquisition time because it exhibits a modified saw-shaped characteristic curve in the vicinity of an unstable point.

Embodiments of the present invention offer the following benefits. Since convergence characteristics are improved in an acquisition state having high phase errors in a PLL, almost the same convergence characteristics as those of the conventional saw-shaped phase detection are achieved. Also, hardware complexity is remarkably reduced by configuring a phase detector in the PLL to use a simple hardware addition. In the steady state, the phase detector exhibits a sinusoidal characteristic curve. Therefore, it outperforms a conventional phase detector with the saw-shaped characteristic curve in terms of jitter performance at a low SNR. As a consequence, overall convergence characteristics are improved compared to the conventional technologies.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A phase locked loop (PLL) circuit, comprising:
   a phase detector for determining a period to which an input signal belongs using a real value and an imaginary value of the input signal, and for selectively outputting one of three values of the input signal as an error signal corresponding to the input signal using the determined period, wherein the three values are an imaginary value of the input signal, a difference resulting from subtracting a real value of the input signal from the imaginary value, and a sum of the real value and the imaginary value;
   a loop filter for loop-filtering the error signal; and
   an oscillator for oscillating a predetermined frequency signal according to the loop-filtered error signal and providing the oscillated signal as the feedback signal to the phase detector,
   wherein the phase detector is configured to:
   determine that the input signal belongs to a first period if the real value of the input signal is equal to or greater than a predetermined threshold, and outputting the imaginary value as the error signal;
   determine that the input signal belongs to a second period if the real value of the input signal is less than the threshold and the imaginary value of the input signal is equal to or greater than 0, and outputting the difference as the error signal; and
   determine that the input signal belongs to a third period if the real value of the input signal is less than the threshold and the imaginary value of the input signal is less than 0, and outputting the sum as the error signal.

2. The PLL circuit of claim 1, wherein the phase detector comprises:
   a multiplier for detecting a phase difference between the input signal and the feedback signal by multiplying the input signal by the feedback signal; and
   an error signal generator for determining the period to which the input signal belongs according to the magnitude of a signal received from the multiplier and outputting the error signal according to the determined period.

3. The PLL circuit of claim 2, wherein the error signal generator comprises:
   a real value extractor for extracting the real value from the signal received from the multiplier;
   an imaginary value extractor for extracting the imaginary value from the signal received from the multiplier;
   a calculator for generating a plurality of calculation values using the real value and the imaginary value and outputting the imaginary value and a difference resulting from subtracting the real value from the imaginary value and a sum of the real value and the imaginary value;
   a controller for outputting a selection signal for selecting one of the imaginary value and the difference and the sum; and
   a selector for selecting one of the imaginary value and the difference and the sum according to the selection signal.

4. The PLL circuit of claim 3, wherein the calculator comprises:
   an adder for adding the real value and the imaginary value; and
   a subtractor for subtracting the real value from the imaginary value.

5. A digital phase locking method, comprising the steps of:
   determining a period to which an input signal belongs using a real value and an imaginary value of the input signal;
   selectively outputting one of three values of the input signal as an error signal corresponding to the input signal using the determined period, wherein the three values are an imaginary value of the input signal, a difference resulting from subtracting a real value of the input signal from the imaginary value, and a sum of the real value and the imaginary value;
   loop-filtering the error signal; and
   oscillating a predetermined frequency signal according to the loop-filtered error signal; and
   feeding back the oscillated signal,
   wherein the period determining step comprises the steps of:
   determining that the input signal belongs to a first period if a real value of the input signal is equal to or greater than a predetermined threshold, and outputting the imaginary value as the error signal;
   determining that the input signal belongs to a second period if the real value of the input signal is less than the threshold and the imaginary value of the input signal is equal to or greater than 0, and outputting the difference as the error signal; and
   determining that the input signal belongs to a third period if the real value of the input signal is less than the threshold and the imaginary value of the input signal is less than 0, and outputting the sum as error signal.

6. The digital phase locking method of claim 5, further comprising the step of:
   detecting a phase difference between the input signal and the feedback signal by multiplying the input signal by the feedback signal, and wherein the period determining step comprises the step of determining the period to which the input signal belongs according to the magnitude of the real value and the imaginary value of the product signal.

7. A receiver, comprising:
   a reception part for receiving a radio frequency (RF) signal from an antenna and outputting an intermediate frequency (IF) signal;
   an analog-to-digital converter (ADC) for converting the IF signal into a digital signal;
   a phase locked loop (PLL) for compensating the phase of the digital signal; and
   a synchronizer for synchronizing the frequency of the digital signal based on the output of the PLL, wherein the PLL is configured to determine a period to which an input signal belongs using a real value and an imaginary value of the input signal, to selectively output one of three values of the input signal as an error signal corresponding to the input signal using the determined period, wherein the three values are an imaginary value of the input signal, a difference resulting from subtracting a real value of the input signal from the imaginary value, and a sum of the real value and the imaginary value, to oscillate a predetermined frequency signal according to the error signal, and to feed back the oscillated signal, wherein the phase detector is configured to:

determine that the input signal belongs to a first period if a real value of the input signal is equal to or greater than a predetermined threshold, and outputting the imaginary value as the error signal;

determine that the input signal belongs to a second period if the real value of the input signal is less than the threshold and the imaginary value of the input signal is equal to or greater than 0, and outputting the difference as the error signal; and determine that the input signal belongs to a third period if the real value of the input signal is less than the threshold and the imaginary value of the input signal is less than 0, and outputting the sum as the error signal.

8. The receiver of claim 7, wherein the PLL comprises:

a phase detector for determining the period to which the real value and the imaginary value of the input signal belongs according to the magnitude of the input signal, and for selectively outputting one of the three values of the input signal as the error signal according to the determined period;

a loop filter for loop-filtering the error signal; and an oscillator for oscillating the predetermined frequency signal according to the loop-filtered error signal and providing the oscillated signal as the feedback signal to the phase detector.

9. The receiver of claim 8, wherein the phase detector comprises:

a multiplier for detecting a phase difference between the input signal and the feedback signal by multiplying the input signal by the feedback signal; and an error signal generator for determining the period to which the input signal belongs according to the magnitude of the real value and the imaginary value of a signal received from the multiplier and for selectively outputting one of the three values of the input signal as the error signal corresponding to the input signal using the determined period.

10. The receiver of claim 9, wherein the error signal generator comprises:

a real value extractor for extracting the real value from the signal received from the multiplier;

an imaginary value extractor for extracting the imaginary value from the signal received from the multiplier;

a calculator for generating a plurality of calculation values using the real value and the imaginary value and outputting the imaginary value and a difference resulting from subtracting the real value from the imaginary value and a sum of the real value and the imaginary value;

a controller for outputting a selection signal for selecting one of the imaginary value and the difference and the sum; and a selector for selecting one of the imaginary value and the difference and the sum according to the selection signal.

11. The receiver of claim 10, wherein the calculator comprises:

an adder for adding the real value and the imaginary value; and a subtractor for subtracting the real value from the imaginary value.

12. The receiver of claim 7, further comprising:

a demodulator for demodulating a baseband signal after phase compensation; and a channel decoder for decoding the demodulated signal.

13. A receiver, comprising:

a reception part for receiving a radio frequency (RF) signal from an antenna and outputting a baseband signal;

an analog-to-digital converter (ADC) for converting the baseband signal to a digital signal; and a phase locked loop (PLL) for compensating the phase of the digital signal, wherein the PLL is configured to determine a period to which an input signal belongs using a real value and an imaginary value of the input signal, to selectively output one of three values of the input signal as an error signal corresponding to the input signal using the determined period, wherein the three values are an imaginary value of the input signal, a difference resulting from subtracting a real value of the input signal from the imaginary value, and a sum of the real value and the imaginary value as an error signal corresponding to the input signal using the determined period, to oscillate a predetermined frequency signal according to the error signal and the real value and the imaginary value, and to feed back the oscillated signal, wherein the phase detector is configured to:

determine that the input signal belongs to a first period if a real value of the input signal is equal to or greater than a predetermined threshold, and outputting the imaginary value as the error signal;

determine that the input signal belongs to a second period if the real value of the input signal is less than the threshold and the imaginary value of the input signal is equal to or greater than 0, and outputting the difference as the error signal; and determine that the input signal belongs to a third period if the real value of the input signal is less than the threshold and the imaginary value of the input signal is less than 0, and outputting the sum as the error signal.

14. The receiver of claim 13, further comprising:

a digital-to-analog converter (DAC) for converting the output of the PLL into an analog signal arid feeding back the analog signal to the reception part.

15. The receiver of claim 13, wherein the PLL comprises:

a phase detector for determining the period to which the input signal belongs according to the magnitude of the real value and the imaginary value of the input signal, and outputting the error signal according to the determined period;

a loop filter for loop-filtering the error signal; and an oscillator for oscillating the predetermined frequency signal according to the loop-filtered error signal and providing the oscillated signal as the feedback signal to the phase detector.

16. The receiver of claim 15, wherein the phase detector comprises:

a multiplier for detecting a phase difference between the input signal and the feedback signal by multiplying the input signal by the feedback signal; and an error signal generator for determining the period to which the input signal belongs according to the magnitude of the real value and the imaginary value of a signal received from the multiplier and outputting the imaginary value and a difference resulting from subtracting the real value from the imaginary value and a sum of the real value and the imaginary value as the error signal according to the determined period.

17. The receiver of claim 16, wherein the error signal generator comprises:
a real value extractor for extracting the real value from the signal received from the multiplier;
an imaginary value extractor for extracting the imaginary value from the signal received from the multiplier;
a calculator for generating a plurality of calculation values using the real value and the imaginary value and outputting the imaginary value and the difference and the sum;
a controller for outputting a selection signal for selecting one of the imaginary value and the difference and the sum; and
a selector for selecting one of the imaginary value and the difference and the sum according to the selection signal.

18. The receiver of claim 17, wherein the calculator comprises:
an adder for adding the real value and the imaginary value; and
a subtractor for subtracting the real value from the imaginary value.

19. The receiver of claim 13, further comprising:
a demodulator for demodulating a baseband signal whose phase is compensated in the PLL; and
a channel decoder for decoding the demodulated signal.

20. A receiver, comprising:
a reception part for receiving a radio frequency (RF) signal from an antenna and outputting a baseband signal;
an analog-to-digital converter (ADC) for converting the baseband signal to a digital signal;
a phase locked loop (PLL) for compensating the time of the digital signal; and
a sampler for acquiring time synchronization for the digital signal,
wherein the PLL is configured to determine a period to which an input signal belongs using a real value and an imaginary value of the input signal, to selectively output one of three values of the input signal as an error signal corresponding to the input signal using the determined period, wherein the three values are an imaginary value of the input signal, a difference resulting from subtracting a real value of the input signal from the imaginary value, and a sum of the real value and the imaginary value as an error signal corresponding to the input signal using the determined period, to oscillate a predetermined frequency signal according to the error signal, and to feed back the oscillated signal,
wherein the phase detector is configured to:
determine that the input signal belongs to a first period if a real value of the input signal is equal to or greater than a predetermined threshold, and outputting the imaginary value as the error signal;
determine that the input signal belongs to a second period if the real value of the input signal is less than the threshold and the imaginary value of the input signal is equal to or greater than 0, and outputting the difference as the error signal; and
determine that the input signal belongs to a third period if the real value of the input signal is less than the threshold and the imaginary value of the input signal is less than 0, and outputting the sum as the error signal.

21. The receiver of claim 20, wherein the PLL comprises:
a phase detector for determining the period to which the input signal belongs according to the magnitude of the real value and the imaginary value of the input signal, and outputting the imaginary value and the difference and the sum as the error signal according to the determined period;
a loop filter for loop-filtering the error signal; and
an oscillator for oscillating the predetermined frequency signal according to the loop-filtered error signal and providing the oscillated signal as the feedback signal to the phase detector.

22. The receiver of claim 21, wherein the phase detector comprises:
a multiplier for detecting a phase difference between the input signal and the feedback signal by multiplying the input signal by the feedback signal; and
an error signal generator for determining the period to which the input signal belongs according to the magnitude the real value and the imaginary value of a signal received from the multiplier and outputting the imaginary value and the difference and the sum as the error signal according to the determined period.

23. The receiver of claim 12, wherein the error signal generator comprises:
a real value extractor for extracting the real value from the signal received from the multiplier;
an imaginary value extractor for extracting the imaginary value from the signal received from the multiplier;
a calculator for generating a plurality of calculation values using the real value and the imaginary value and outputting the imaginary value and a difference resulting from subtracting the real value from the imaginary value and a sum of the real value and the imaginary value;
a controller for outputting a selection signal for selecting one of the imaginary value and the difference and the sum; and
a selector for selecting one of the imaginary value and the difference and the sum according to the selection signal.

24. The receiver of claim 23, wherein the calculator comprises:
an adder for adding the real value and the imaginary value; and
a subtractor for subtracting the real value from the imaginary value.

25. The receiver of claim 20, further comprising:
a demodulator for demodulating a signal whose phase is compensated in the PLL; and
a channel decoder for decoding the demodulated signal.

* * * * *